United States Patent
Yuan et al.

(10) Patent No.: US 7,023,693 B2
(45) Date of Patent: Apr. 4, 2006

(54) MOUNTING APPARATUS FOR PERIPHERAL DEVICE

(75) Inventors: Ming-Huan Yuan, Tu-chen (TW); Cheng Kung Chung, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 68 days.

(21) Appl. No.: 10/392,604

(22) Filed: Mar. 19, 2003

(65) Prior Publication Data

US 2004/0100762 A1  May 27, 2004

(30) Foreign Application Priority Data

Nov. 27, 2002  (TW) .............................. 91219117 U (51) Int. Cl.
*G06F 1/16* (2006.01)

(52) U.S. Cl. ................. 361/685; 312/223.1; 312/223.2

(58) Field of Classification Search ................ 361/683, 361/685, 724–727; 312/223.1, 223.2, 223.3, 312/333; 369/75.1, 79
See application file for complete search history.

(56) References Cited

U.S. PATENT DOCUMENTS

| 6,288,902 | B1 * | 9/2001 | Kim et al. ................ 361/725 |
| 6,460,948 | B1 * | 10/2002 | Roesner et al. .......... 312/223.1 |
| 6,560,098 | B1 * | 5/2003 | Beinor, Jr. et al. ......... 361/685 |
| 6,603,657 | B1 * | 8/2003 | Tanzer et al. ............... 361/685 |
| 2001/0001529 | A1 * | 5/2001 | Behl et al. ............... 312/223.1 |

FOREIGN PATENT DOCUMENTS

TW  467354  6/2000

\* cited by examiner

*Primary Examiner*—Lisa Lea-Edmonds
*Assistant Examiner*—Anthony Q. Edwards
(74) *Attorney, Agent, or Firm*—Wei Te Chung (57) ABSTRACT

A peripheral device mounting apparatus includes a peripheral device carrier and a peripheral device rack. The carrier includes a drive bracket (30), a front bezel (40), and a lever (50) pivotably attached to the bezel and biased by a spring (60). The bezel includes a locking arm (45) and two projections (47). The lever includes a stopper (51), a handle (52), and an intermediate connecting wall (57). The stopper defines two grooves (54) slidingly and then engagingly receiving the projections, so as to retain the connecting wall in a vertical position. The carrier is then slid into the rack. When the carrier is almost fully received in the rack, the connecting wall abuts a front of the rack. The handle is then rotated, and the carrier is fully received in the rack. The locking arm engages with the handle, and the stopper retainingly extends through a hole of the rack.

17 Claims, 7 Drawing Sheets

MOUNTING APPARATUS FOR PERIPHERAL DEVICE

BACKGROUND OF THE INVENTION

1. Field of the Invention

The present invention relates to computer equipment enclosures, and particularly to a peripheral device mounting apparatus having a peripheral device rack and peripheral device carriers.

2. Prior Art

Many computer systems, including personal computers, workstations, servers, and embedded systems are designed to have multiple peripheral devices included therein. A typical personal computer system includes a processor, associated memory and control logic, and a number of peripheral devices that provide input and output (I/O) for the system. Such peripheral devices include, for example, compact disk read-only memory (CD-ROM) drives, hard disk drives, and floppy disk drives. Additionally, computer systems often have capability to interface with external enclosures that include additional peripheral devices.

Figure 7:
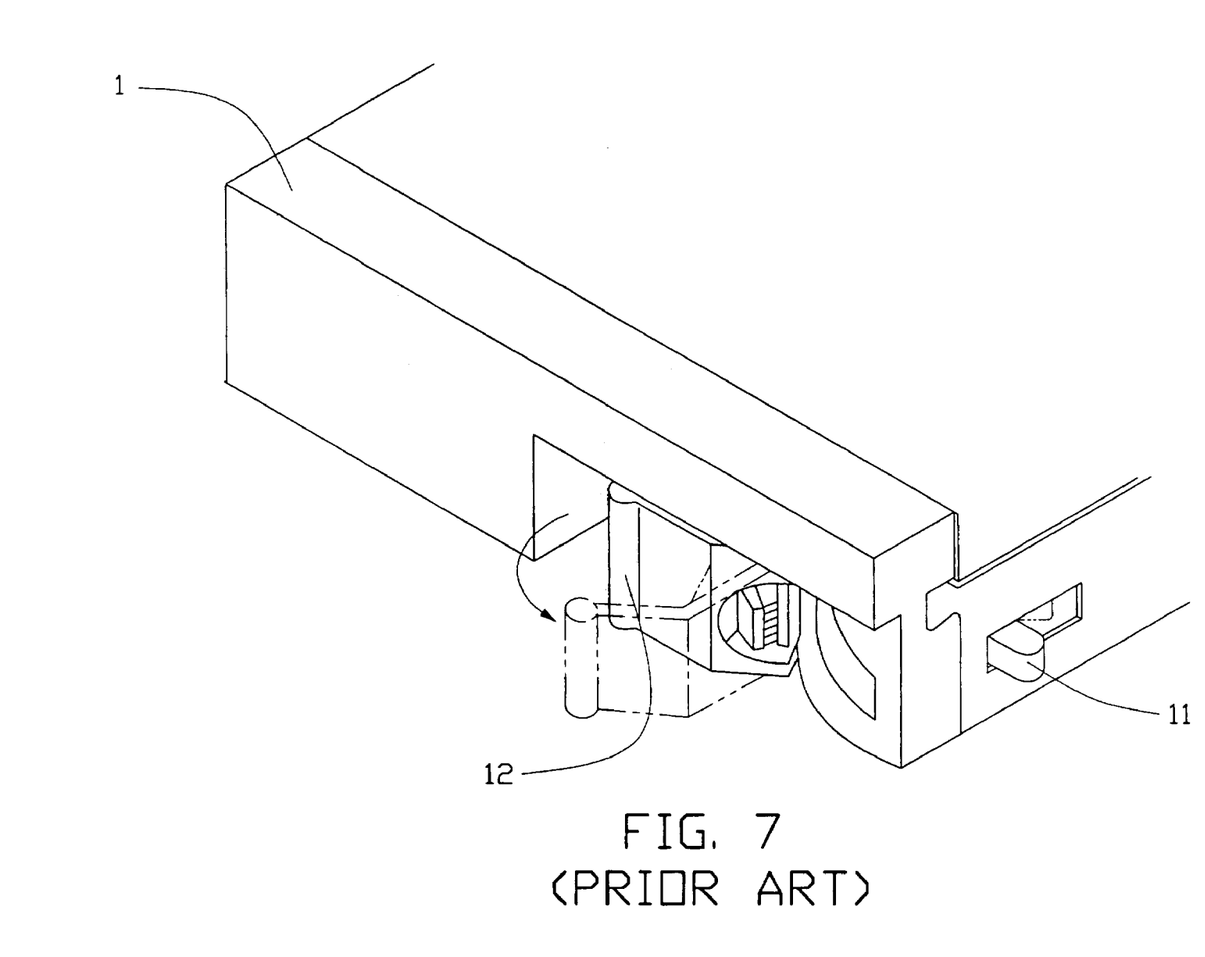
FIG. 7 is an isometric view of a conventional peripheral device carrier received in a rack of a conventional peripheral device mounting apparatus.

For many applications, it is desirable to include a maximum possible number of peripheral devices enclosed in a chassis of a computer system. For example, a large number of hard disk drives can enhance the system's external memory capability. An example of this type of computer system is disclosed in Taiwan Pat. No. 467354. As shown in FIG. 7, a peripheral device carrier 1 has a handle 12 at the front thereof, and a projection 11 at the side thereof. To install the carrier 1 in a peripheral device rack (not labeled), the handle 12 is pushed in a first direction. The projection 11 is thus extended through a hole of the rack. To remove the carrier 1 from the rack, the handle 12 is simply pushed in an opposite second direction, and the projection 11 is released from the hole of the rack. However, when the carrier 1 is slid into the rack, it is substantially obscured by walls of the rack. The user is unable to easily ascertain whether the carrier 1 has reached a correct installed position. As a result, the carrier 1 may be over-inserted into the rack. When this happens, the carrier 1 may become stuck in the rack. In addition, the carrier or the rack may be damaged. In particular, electrical terminals inside the rack may be damaged by the leading end of the carrier.

Thus an improved peripheral device carrier and peripheral device rack which overcome the above-mentioned problems is desired.

SUMMARY OF THE INVENTION

Accordingly, an object of the present invention is to provide a mounting apparatus which allows convenient installation and removal of a peripheral device carrier into and from a peripheral device rack.

Another object of the present invention is to provide an apparatus for mounting a peripheral device carrier into a peripheral device rack with minimal risk of damage to the carrier.

To achieve the above objects, a peripheral device mounting apparatus in accordance with a preferred embodiment of the present invention comprises a peripheral device carrier for receiving a peripheral device therein, and a peripheral device rack for receiving the carrier therein. The carrier comprises a drive bracket, a bezel attached to a front face of the drive bracket, a lever, and a spring. The drive bracket comprises a first side plate defining a first opening and a second side plate defining a second opening. An aperture is defined in the bezel corresponding to the first opening. A locking arm extends from the bezel. A pair of projections is formed at opposite sides of the aperture. The lever comprises a stopper, and a handle connected with the stopper by a connecting wall. A pair of grooves is defined in top and bottom surfaces respectively of the stopper. The rack comprises an upper wall defining a plurality of through holes therein. The projections of the bezel are slidingly received in the grooves of the lever, and then snappingly engaged in end portions of the grooves. The connecting wall is thereby retained in a vertical position. The carrier is then slid into the rack. When the carrier is almost fully received in the rack, the connecting wall of the lever is blocked by a front frame of the rack. The handle is then rotated downwardly and inwardly, and the carrier is fully received in the rack. The locking arm engages with the handle, and the stopper extends through a corresponding through hole of the upper wall. The stopper is prevented from moving forwardly by the upper wall at a front side of the through hole. The lever is held in equilibrium in this position, with the spring resiliently pulling the stopper, and the locking arm retaining the handle. The carrier is thus securely received in the rack.

Other objects, advantages and novel features of the present invention will be drawn from the following detailed description of the preferred embodiment of the present invention with the attached drawings, in which:

DESCRIPTION OF THE PREFERRED EMBODIMENT

The present invention will be described in its preferred embodiment, and in conjunction with a peripheral device such as a hard disk driver (HDD) (not shown).

Figure 1:
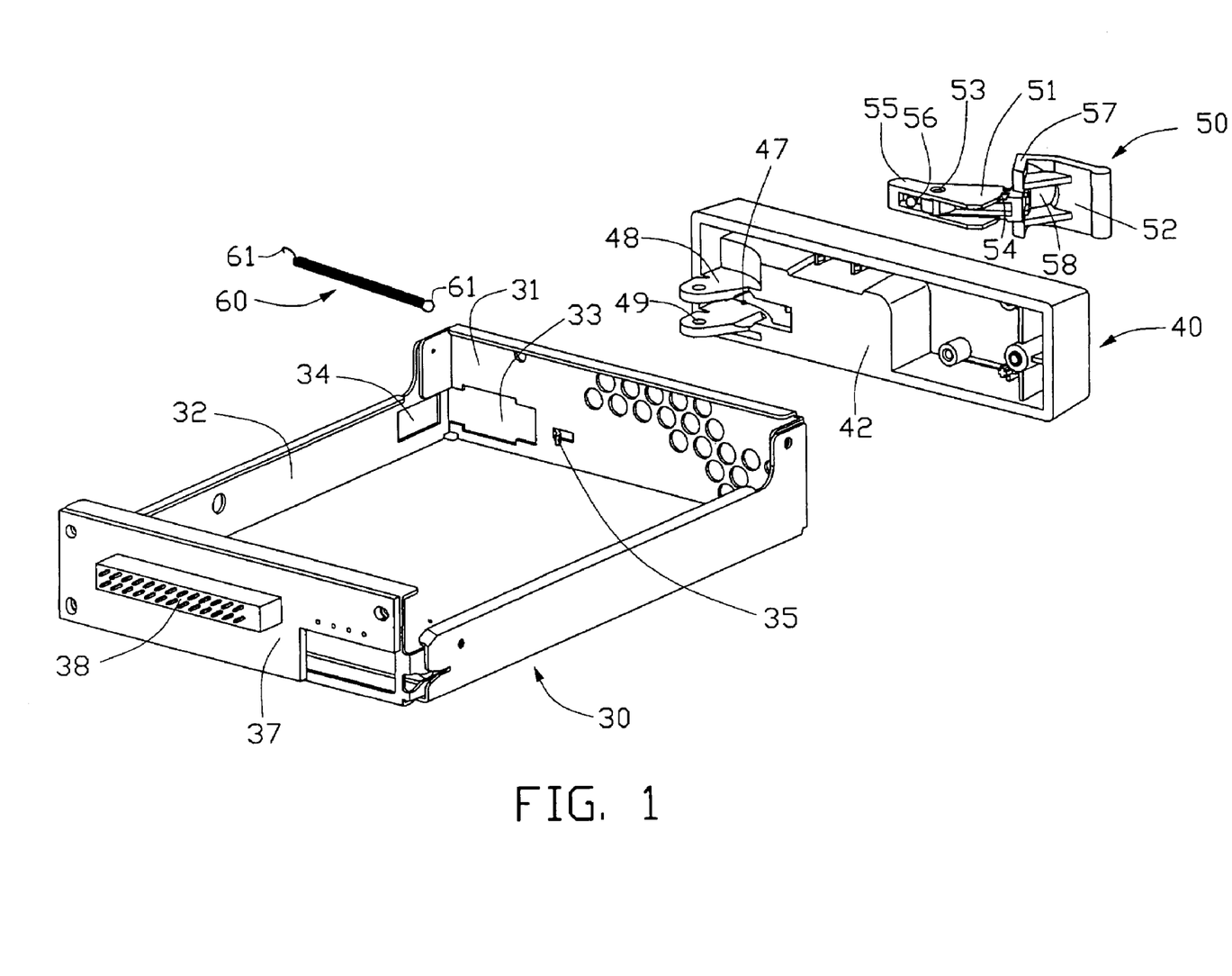
FIG. 1 is an exploded, isometric view of a peripheral device carrier in accordance with the preferred embodiment of the present invention, the carrier comprising a drive bracket, a bezel and a lever.
Figure 2:
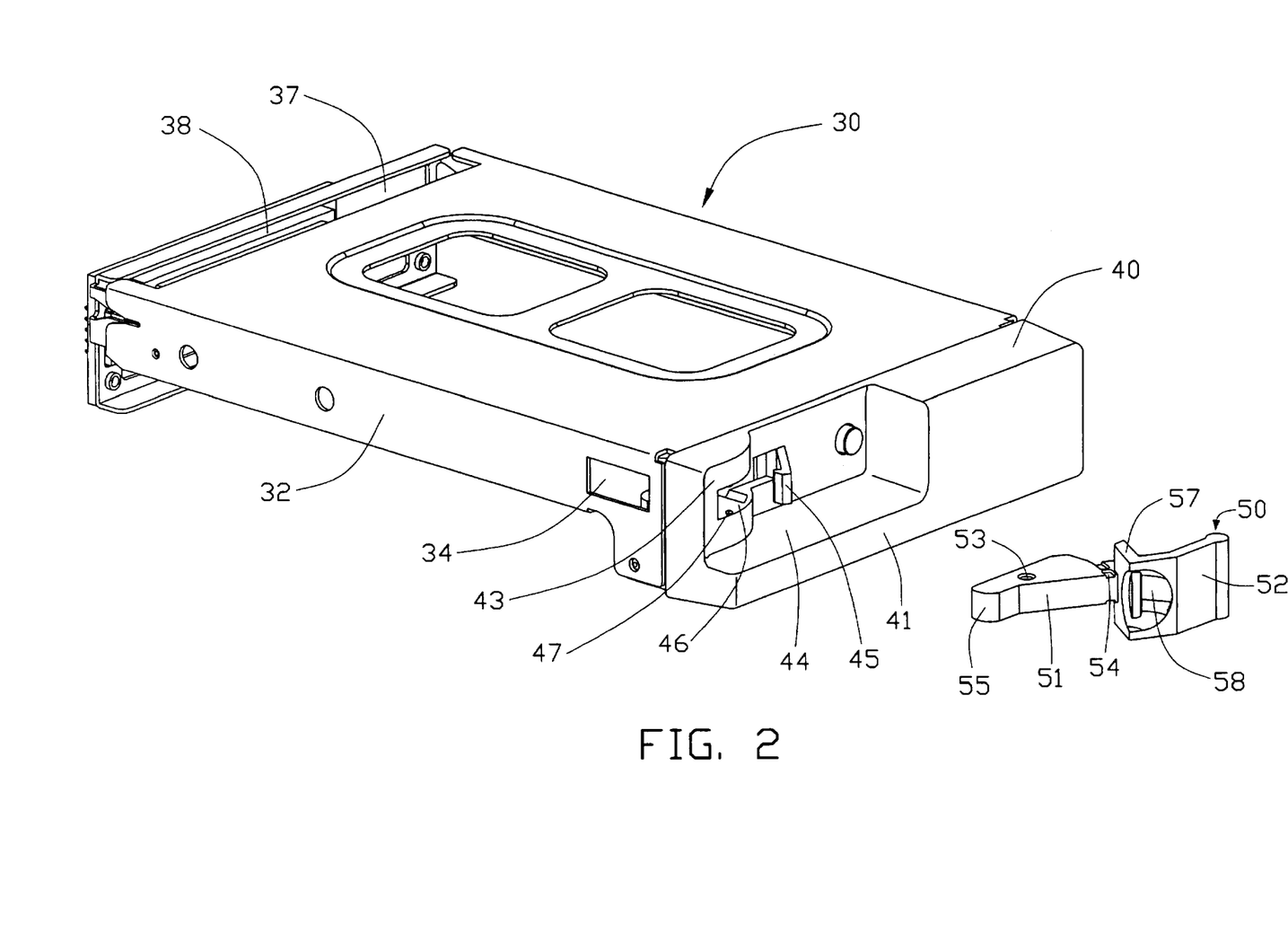
FIG. 2 is a partly assembled view of FIG. 1, showing the bezel attached to the drive bracket, and viewed from another aspect.
Figure 3:
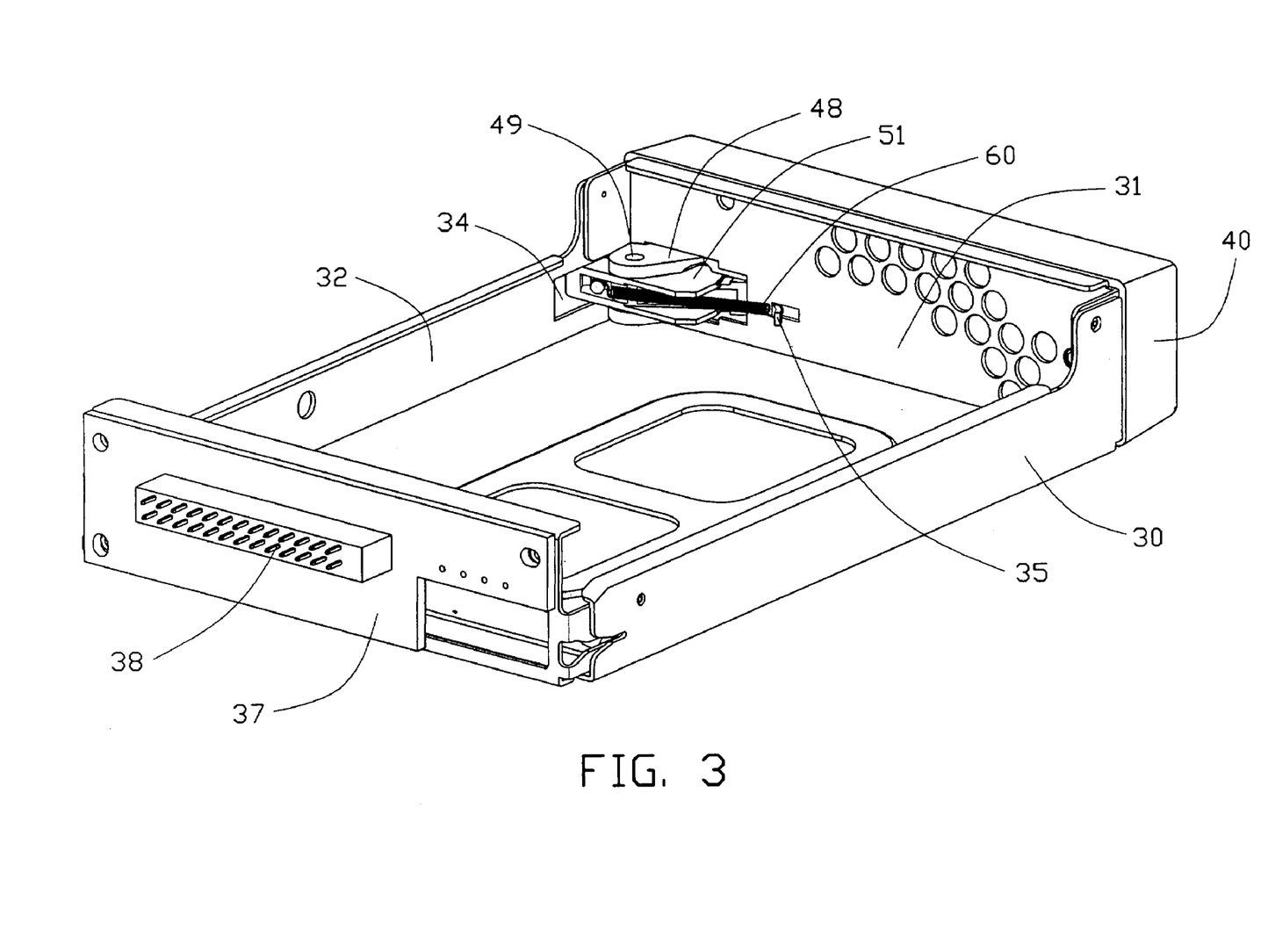
FIG. 3 is a fully assembled view of FIG. 1.

FIGS. 1, 2 and 3 show a peripheral device carrier of a peripheral device mounting apparatus in accordance with a preferred embodiment of the present invention. The carrier is for retaining the HDD therein.

The carrier includes a drive bracket 30, a bezel 40 installed at a front face of the drive bracket 30, a lever 50, and a spring 60. The drive bracket 30 comprises a base plate (not labeled), and a first side plate 31, a second side plate 32 and a third side plate 37 extending upwardly from respective edges of the base plate. The second side plate 32 is adjacent the first side plate 31. The third side plate 37 is opposite from the first side plate 31. The base plate and the first, second and third side plates 31, 32, 37 cooperatively define a space (not labeled) therebetween for receiving the HDD therein.

The first side plate 32 defines a first opening 33 therein adjacent a junction of the first side plate 31 and the second side plate 32. The second side plate 32 defines a second opening 34 therein adjacent said junction. The openings 33, 34 are disposed at a same level. The first side plate 31 has an oblique catch tongue 35, formed by stamping the first side plate 31 inwardly. A male connector 38 is mounted on an outside of the third side plate 37.

The bezel 40 comprises a main outer first side 41, and a main inner second side 42 opposite from the first side 41. A large recess 44 is defined in the first side 41 of the bezel 40. A convex flange 43 is formed at the first side 41 at an endmost region of the recess 44. The flange 43 defines an aperture 46 therethrough. The aperture 46 extends from the first side 41 to the second side 42, and effectively divides the flange 43 into two parts. The two parts of the flange 43 each have a convex surface extending from the first side 41 to the second side 42. A pair of ears 48 extends rearwardly from the second side 42 at said two parts of the flange 43, at opposite sides of the aperture 46 respectively. A pair of projections 47 is respectively formed on the ears 48 at the first side 41, the projections 47 opposing each other across the aperture 46. A pair of first pivot holes 49 is defined in rear ends of the ears 48 respectively. A locking arm 45 extends obliquely from the first side 41 into the recess 44, the locking arm 45 being formed by stamping the bezel 40.

The lever 50 comprises a stopper 51, and a handle 52 connected with the stopper 51 by a connecting wall 57. A pair of grooves 54 is defined in top and bottom surfaces respectively of the stopper 51, adjacent the connecting wall 57. The grooves 54 are for slidingly and then engagingly receiving the projections 47 of the bezel 40. The handle 52 defines a locking hole 58 therein. The stopper 51 comprises a hollow end portion 55 distal from the handle 52. A protrusion 56 is formed inside the end portion 55 of the stopper 51. A catch hole (not labeled) is defined in the protrusion 56. A second pivot hole 53 is defined in the stopper 51 adjacent the end portion 55, corresponding to the first pivot holes 49 of the bezel 40.

The spring 60 has a pair of hooks 61 at opposite ends thereof respectively.

Referring to FIG. 3, in assembly of the carrier, the second side 42 of the bezel 40 is placed against an outside of the first side plate 31. Screws (not shown) are inserted through the bezel 40 and engaged in the first side plate 31, thereby attaching the bezel 40 to the drive bracket 30. The ears 48 of the bezel 40 protrude through the opening 33 of the first side plate 31 into said space of the drive bracket 30. Then the end portion 55 of the stopper 51 of the lever 50 is extended through the aperture 46 between the ears 48 of the bezel 40. The second pivot hole 53 of the lever 50 is aligned with the first pivot holes 49 of the bezel 40. A pivot pin (not shown) is extended through the first and second pivot holes 49, 53, thereby rotatably attaching the lever 50 to the bezel 40. One of the hooks 61 of the spring 60 is engaged in the catch hole of the protrusion 56 of the lever 50. The other hook 61 of the spring 60 is engaged with the locking tab 35 of the drive bracket 30. Thus the drive bracket 30, the bezel 40, the lever 50 and the spring 60 are attached together. The lever 50 is pivotably movable in the opening 33 of the first side plate 31, and the end portion 55 is pivotably movable in the opening 34 of the second side plate 32.

Figure 4:
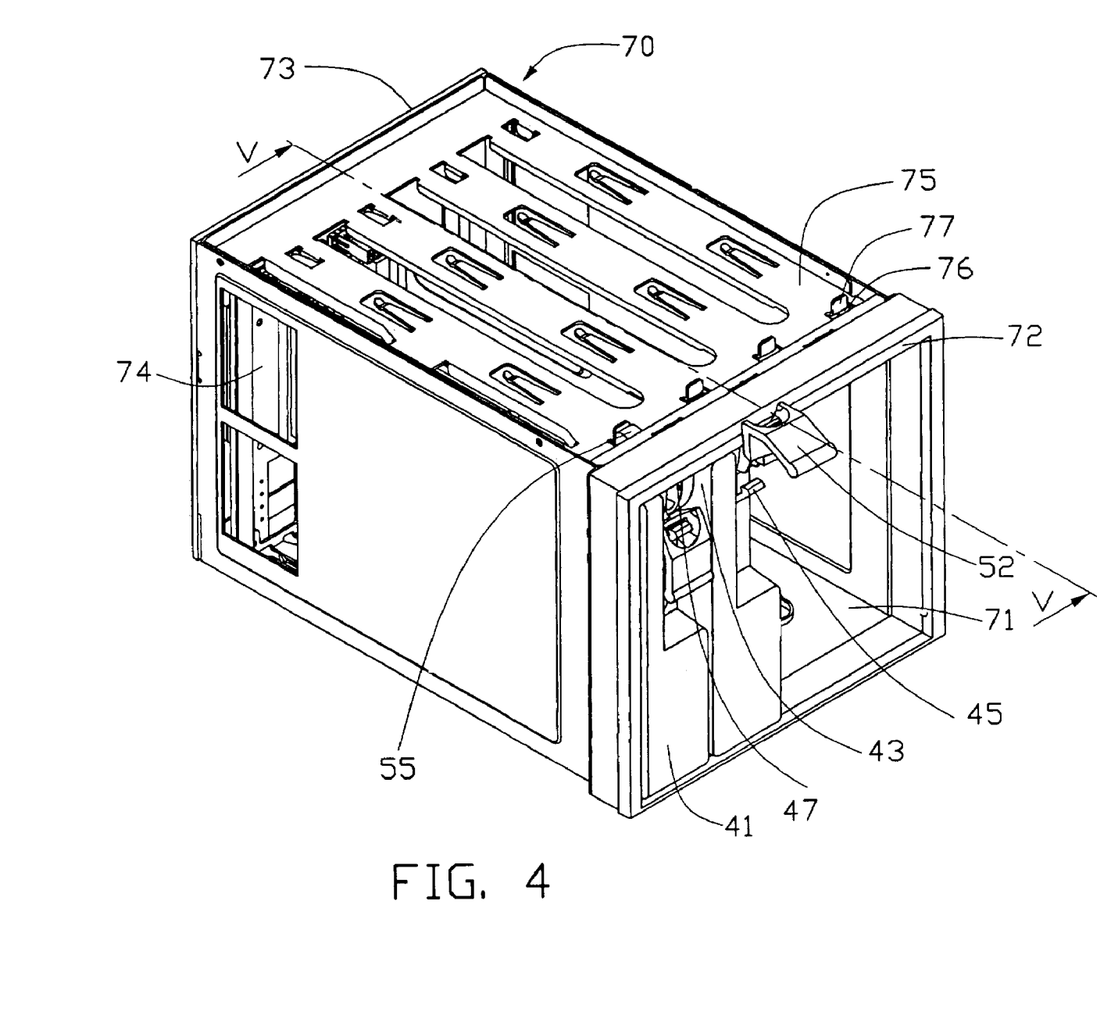
FIG. 4 is an exploded, isometric view of the peripheral device mounting apparatus in accordance with the preferred embodiment of the present invention, showing two carriers of FIG. 1 received in a rack of the mounting apparatus.

Referring to FIG. 4, a peripheral device rack 70 has a generally parallelepiped-shaped construction. The rack 70 comprises an upper wall 75, a bottom wall (not labeled), a rear wall 73, and a front frame 72 defining a front opening 71 for insertion and removal of carriers therethrough. An inside of the upper wall 75 and an inside of the bottom wall each comprise a plurality of parallel carrier guides (not labeled). The carrier guides facilitate insertion and removal of carriers, and retention of the carriers in the rack 70. A plurality of aligned guide tabs 77 is provided on the upper wall 75 adjacent the front opening 71, the guide tabs 77 being formed by stamping the upper wall 75 outwardly. A plurality of through holes 76 is thus defined in the upper wall 75, respectively adjacent the guide tabs 77. A plurality of female connectors 74 is respectively provided on an inside of the rear wall 73.

Figure 5:
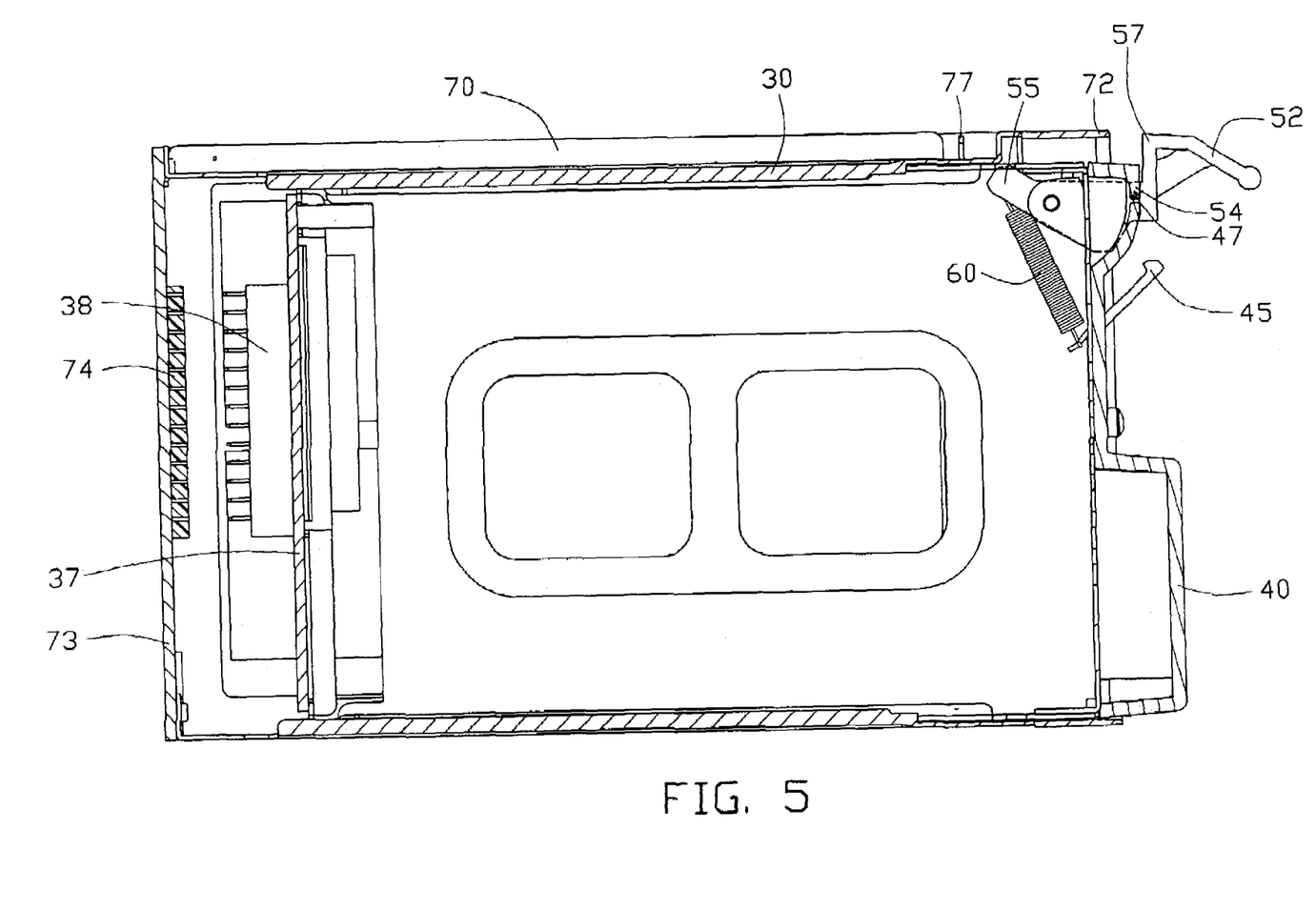
FIG. 5 is a cross-sectional side elevation view taken along line V—V of FIG. 4, showing one of said two carriers almost fully received in the rack.
Figure 6:
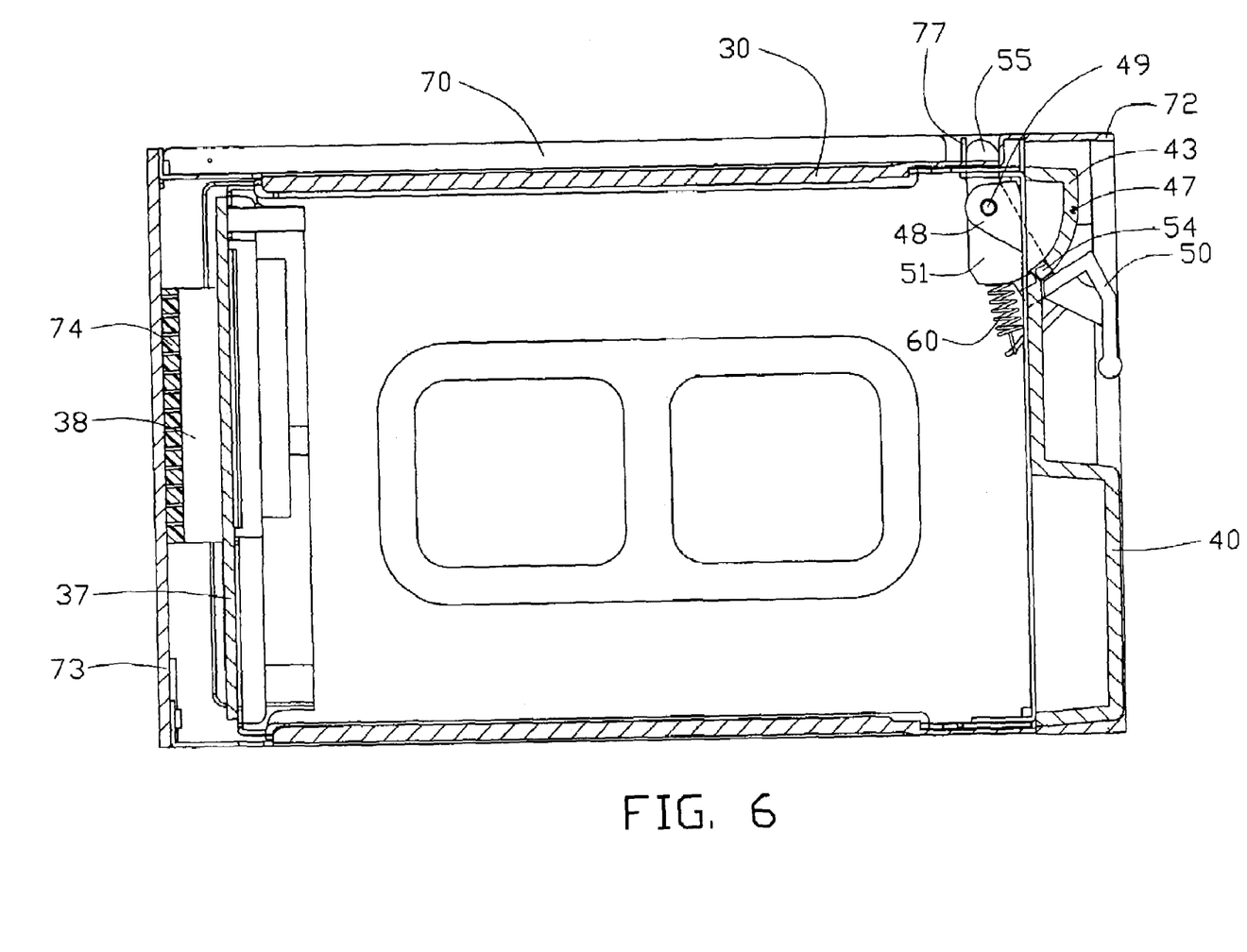
FIG. 6 is similar to FIG. 5, but showing said one carrier fully received in the rack.

Referring also to FIGS. 5 and 6, to install any of the carriers into the rack 70, the carrier is inserted into the front opening 71 and slidingly received in corresponding carrier guides. The handle 52 is rotated upwardly. The projections 47 of the bezel 40 are respectively slidingly received in the grooves 54 of the lever 50, and then snappingly engaged in end portions of the grooves 54. The connecting wall 57 is thereby retained in a vertical position. The carrier is then slid along the carrier guides until the connecting (engagement) wall 57 is blocked by the front frame 72 of the upper wall 75. In this position, the carrier is almost fully received in the rack 70, with the male connector 38 of the drive bracket 30 closely opposing a corresponding female connector 74 of the rack 70. The handle 52 is pushed to make the lever 50 rotate downwardly. As the lever 50 rotates downwardly, the spring 60 is stretched. The locking arm 45 of the bezel 40 snappingly engages in the locking hole 58 of the handle 52. Simultaneously, the end portion 55 rides over a bottom of a corresponding guide tab 55, and is received in a corresponding through hole 76 of the upper wall 75. The end portion 55 is prevented from moving rearwardly by the guide tab 55, and is prevented from moving forwardly by an edge of the upper wall 75 at the through hole 76. The lever 50 is held in equilibrium in this position, with the elongated spring 60 resiliently pulling the end portion 55, and the locking arm 45 retaining the handle 52. The carrier is thus securely received in the rack 70.

To remove the carrier out from the rack 70, an end of the locking arm 45 is pushed downwardly while simultaneously pulling the handle 52 upwardly. The locking arm 45 of the bezel 40 is released from the locking hole 58 of the handle 52, and the lever 50 is rotated outwardly. The end portion 55 of the lever 50 exits the through hole 76. The carrier is then easily slid out from the rack 70.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A peripheral device mounting apparatus comprising:
a peripheral device rack having a front edge portion;
a drive bracket adapted for receiving a peripheral device therein and received in the rack, the drive bracket comprising a front plate with a first opening defined therein;
a bezel attached to an outside of the front plate of the drive bracket, the bezel defining an aperture corresponding to the first opening of the front plate, the bezel comprising a protrusion extending therefrom at one side of the aperture, the bezel further comprising a locking arm extending outwardly therefrom;

a lever pivotally received in the aperture, the lever comprising a stop portion extending into the first opening of the front plate, the stop portion defining a groove engagingly receiving the protrusion when the level is in a first position in which the lever engages with the front edge portion so as to retain the lever in said first position; and spring means for biasing the stop portion in a second position in which the locking arm is engaged with the lever, such that the lever is biased against the locking arm in said second position.

2. The peripheral device mounting apparatus as described in claim 1, wherein two spaced ears extend from the lever at opposite extremities of the aperture into the opening of the front plate, the ears cooperatively define a space therebetween rotatably receiving the stop portion therein.

3. The peripheral device mounting apparatus as described in claim 2, wherein a first and a second pivot holes are respectively defined in the ear and the stop portion, and the lever is pivotably mounted in the space between the ears by a pivot extending through the first and second pivot holes.

4. The peripheral device mounting apparatus as described in claim 1, wherein the drive bracket further comprises a side plate defining a second opening, the rack comprises a wall defining a through hole, and the stop portion of the level extends through the second opening and the through hole when the lever is in said second position.

5. The peripheral device mounting apparatus as described in claim 4, wherein the wall comprises a guide tab extending therefrom adjacent the through hole, for guiding the stop portion of the lever.

6. The peripheral device mounting apparatus as described in claim 1, wherein the lever comprises a handle connected with the stop portion by a connecting wall, the connecting wall abutting the front edge portion when the lever is in said first position.

7. The peripheral device mounting apparatus as described in claim 6, wherein the grooves are defined near the connecting wall.

8. The peripheral device mounting apparatus as described in claim 1, wherein the front plate comprises first catch means engaging with one end of the spring means, and a distal end portion of the stopper comprises second catch means engaging with an opposite end of the spring means.

9. The peripheral device mounting apparatus as described in claim 1, wherein the handle of the lever defines a locking hole engagingly receiving the locking arm in said second position.

10. A peripheral device assembly comprising:
a peripheral device rack comprising a wall defining a through hole;
a drive bracket slidably mounted in the housing, the drive bracket having a front plate and a side plate each defining an opening;
a peripheral device received in the drive bracket;
a bezel attached to the front plate, and defining an aperture in communication with the opening of the front plate, the bezel comprising a locking arm extending generally away from the front plate, and further comprising a pair of protrusions formed at opposite sides of the aperture;
an operation lever pivotably mounted in the aperture and extending through the opening of the front plate, the operation lever integrally comprising a first end portion, an intermediate portion and a second end portion;
a pair of grooves defined in the operation lever corresponding to the protrusions; and
spring means connected between the first end portion of the operation lever and the front plate;
wherein the grooves engagingly receive the protrusions so as to retain the operation lever in a first position in which the intermediate portion thereof abuts a front edge portion of the rack, and the locking arm engages with the second end portion so as to bias the operation lever in a second position in which the first end portion extends through the through hole of the rack and thereby prevents the drive bracket from sliding out from the rack.

11. The peripheral device assembly as described in claim 10, wherein a pair of spaced ears extends from the bezel at opposite extremities of the aperture, each of the ears defining a first pivot hole therein, the first end portion of the operation lever defines a second pivot hole therein, and the operation lever is pivotably mounted between the ears by a pivot extending through the first and second pivot holes.

12. The peripheral device assembly as described in claim 10, wherein the second end portion defines a locking hole engagingly receiving the locking arm in the second position.

13. The peripheral device assembly as described in claim 10, wherein the wall of the peripheral device rack further comprises a guide tab extending therefrom adjacent the through hole, for guiding the first end portion of the operation lever.

14. A peripheral device mounting apparatus comprising:
a peripheral device rack defining a front face thereof, and a locking opening adjacent to said front face;
a drive bracket received in the peripheral device rack;
a bezel disposed on a front face of the drive bracket; and
a lever pivotally mounted to the bezel, said lever including:
a locking end and a handle located at two opposite of a pivot thereof, an engagement wall extending outwardly between the pivot and the handle, for preventing the drive bracket further moving into the peripheral device rack;
a first locking device formed on one of the drive bracket and the bezel;
a second locking device formed in the lever; and
a biasing device connected between the lever and one of the drive bracket and the bezel;
wherein when the locking end is latchably received in the locking opening, the handle is substantially located in a near position relative to the front face of the peripheral device rack and the first locking device and the second locking device are latched to each other to resist forces derived from the biasing device.

15. The device as described in claim 14, wherein said locking device is a locking arm and said second locking device is a locking hole.

16. The device as described in claim 14, wherein said engagement wall abuts against the front face of the peripheral device rack for preventing the drive bracket from further moving into the peripheral device rack.

17. The device as described in claim 14, wherein the biasing device is located behind the front face of the drive bracket.

* * * * *